United States Patent [19]

Deprez

[11] Patent Number: 5,691,104
[45] Date of Patent: Nov. 25, 1997

[54] METHOD FOR MAKING BY PHOTOTYPESETTING A LITHOGRAPHIC PRINTING PLATE ACCORDING TO THE SILVER SALT DIFFUSION TRANSFER PROCESS

[75] Inventor: Lode Deprez, Wachtebeke, Belgium

[73] Assignee: Agfa-Gevaert, N.V., Mortsel, Belgium

[21] Appl. No.: 745,831

[22] Filed: Nov. 12, 1996

Related U.S. Application Data

[60] Provisional application No. 60/009,381, Dec. 29, 1995.

[30] Foreign Application Priority Data

Nov. 16, 1995 [EP] European Pat. Off. .............. 95203140

[51] Int. Cl.$^6$ .............................. G03C 1/34; G03C 8/06; G03F 7/07
[52] U.S. Cl. .................. 430/204; 430/230; 430/611
[58] Field of Search .......................... 430/204, 230, 430/229, 611

[56] References Cited

U.S. PATENT DOCUMENTS

| | | |
|---|---|---|
| 5,427,889 | 6/1995 | Saikawa et al. .................... 430/204 |
| 5,449,585 | 9/1995 | Coppens et al. .................... 430/204 |
| 5,552,258 | 9/1996 | Macioch .......................... 430/204 |
| 5,597,676 | 1/1997 | Van Rompuy et al. .............. 430/204 |

*Primary Examiner*—Richard L. Schilling
*Attorney, Agent, or Firm*—Breiner & Breiner

[57] ABSTRACT

The present invention provides a method for making a lithographic printing plate according to the silver salt diffusion transfer process comprising the following steps:

image-wise exposing with a high intensity-short time exposure an imaging element comprising on a support a photosensitive layer comprising at least one photosensitive silver halide emulsion comprising a heterocyclic compound containing at least one nitrogen atom in the ring and an image receiving layer comprising physical development nuclei in water permeable relationship with said photosensitive layer, developing said imaging element using an alkaline processing liquid in the presence of (a) developing agent(s) and (a) silver halide solvent(s), characterized in that said heterocyclic compound containing at least one nitrogen atom in the ring comprises at least one mercapto- or thione group and one substituent comprising at least 5 carbon atoms selected from the group consisting of linear or branched alkyls, alkenyls, alkynyls, aralkyls and alkylaryls.

9 Claims, No Drawings

METHOD FOR MAKING BY PHOTOTYPESETTING A LITHOGRAPHIC PRINTING PLATE ACCORDING TO THE SILVER SALT DIFFUSION TRANSFER PROCESS

DESCRIPTION

Benefit is claimed from U.S. Provisional application Ser. No. 60/009,381 filed Dec. 29, 1995.

1. Field of the Invention

The present invention relates to a method for obtaining a lithographic printing plate with a silver halide photographic material sensitive to high intensity-short time exposure according to the silver salt diffusion transfer process.

2. Background of the Invention

With recent rapid progress of information transmitting systems, silver halide photographic light sensitive materials have been increasingly required to have high sensitivity. Such systems are, for example, high speed phototypesetting systems according to which information output from an electronic computer is immediately displayed as letters or figures by a cathode ray tube and press facsimile systems for rapid transmission of newspaper originals to a remote place.

Todate on the market phototypesetters usually work with a He/Ne laser (632 nm), laser diode (680 nm) or LED (670 nm or 780 nm). Especially phototypesetters that operate with a He/Ne laser or LED are frequently employed, but also argon lasers (488 nm) are still in use.

For a photographic material to be suitable for use in phototypesetting applications it is required that the material is of high speed to so-called high intensity-short time exposure (flash exposure or scanning exposure), namely exposure for $10^{-4}$ second or less and yields images of high contrast and high resolving power.

Photographic phototypesetting materials include photographic films and papers used in a process for preparing a lithographic printing plate and silver salt diffusion transfer based (hereinafter called DTR-) lithographic printing plates disclosed in e.g. U.S. Pat. No. 4,501,811 and U.S. Pat. No. 4,784,933. With the latter materials a lithographic printing plate is immediately obtained without the need of a contact exposure or camera exposure.

A photographic DTR material preferably comprises a silver halide emulsion mainly consisting of silver chloride in order to obtain a sufficiently high rate of solution of the silver halide and a satisfactory gradation necessary for graphic purposes. Only a small amount of silver bromide and/or silver iodide usually not exceeding 5 mole % is present.

The sensitivity of the imaging element in order to obtain a printing plate should be high. A higher sensitivity results in an easier modulation of the laser intensity.

The sensitivity of an imaging element is influenced by many factors but for an important part by the organic compounds which are comprised in the photosensitive layer of said imaging element, especially the organic stabilizing compound. In most nowadays imaging elements a 1-phenyl-5-mercapto-tetrazole is comprised as a organic stabilizing compounds. However said elements could use a higher sensitivity.

SUMMARY OF THE INVENTION

It is an object of the present invention to provide a method for obtaining a lithographic plate with good printing properties and improved for sensitivity from a silver halide photographic material sensitive to high intensity-short time exposure according to the DTR-process.

Further objects of the present invention will become clear from the description hereinafter.

According to the present invention there is provided a method for making a lithographic printing plate according to the silver salt diffusion transfer process comprising the following steps:

image-wise exposing with a high intensity-short time exposure an imaging element comprising on a support a photosensitive layer comprising at least one photosensitive silver halide emulsion and a heterocyclic compound containing at least one nitrogen atom in the ring and an image receiving layer comprising physical development nuclei in water permeable relationship with said photosensitive layer, developing said imaging element using an alkaline processing liquid in the presence of (a) developing agent(s) and (a) silver halide solvent(s), characterized in that said heterocyclic compound comprises at least one mercapto- or thione group and one substituent comprising at least 5 carbon atoms selected from the group consisting of linear or branched alkyls, alkenyls, alkynyls, aralkyls and alkylaryls.

DETAILED DESCRIPTION OF THE INVENTION

According to the present invention it has been found that an imaging element has a high sensitivity to high intensity-short time exposure and yields a lithographic plate with good printing properties according to the DTR-process when said imaging element comprises a compound as described above.

According to the invention said photosensitive emulsion layer comprises a said compound preferably in an amount ranging from 0.0001 mole/mole of silver halide to 0.01 mole/mole of silver halide, more preferably from 0.0005 mole/mole of silver halide to 0.002 mole/mole of silver halide.

According to the invention said compound preferably is a compound selected from the group consisting of 2-mercapto-5-alkyl-1,3,4-thiadiazoles and 2-mercapto-5-alkyl-1,3,4-oxadiazoles, said 5-alkyl substituents comprising at least 5 carbon atoms.

More preferably said compound corresponds to the following formula:

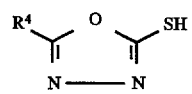

wherein $R^4$ represents an alkyl containing 5 to 17 C-atoms, more preferably wherein $R^4$ represents an alkyl containing 5 to 11 C-atoms, most preferably wherein $R^4$ represents an alkyl containing 7 C-atoms.

According to a preferred embodiment of the present invention the imaging element in connection with the present invention for preparing a lithographic printing plate essentially contains on a support in the order given a photosensitive layer containing a silver halide emulsion and an image receiving layer containing physical development nuclei in water permeable relationship with said emulsion layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or complexed silver ions.

Supports suitable for use in accordance with the present invention may be opaque or transparent, e.g. a paper support or resin support. When a paper support is used preference is given to one coated at one or both sides with an Alpha-olefin polymer, e.g. a polyethylene layer which optionally contains an anti-halation dye or pigment. It is also possible to use an organic resin support e.g. cellulose nitrate film, cellulose acetate film, poly(vinyl acetal) film, polystyrene film, poly(ethylene terephthalate) film, polycarbonate film, polyvinylchloride film or poly-Alpha-olefin films such as polyethylene or polypropylene film. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminium may also be used in accordance with the present invention.

The photographic silver halide emulsions can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al. in "Making and Coating Photographic Emulsion", The Focal Press, London (1966).

According to the present invention the emulsion or emulsions preferably consist principally or totally of silver chloride while a fraction of silver bromide may be present ranging from 0.1 mole % to 40 mole %. When the fraction of silver bromide is 5% or more, the emulsions preferably belong to the core/shell type well known to those skilled in the art in the sense that substantially all the bromide is concentrated in the core. This core contains preferably 10 to 40% of the total silver halide precipitated, while the shell consists preferably of 60 to 90% of the total silver halide precipitated.

The average size of the silver halide grains may range from 0.10 to 0.70 μm, preferably from 0.25 to 0.45 μm.

Preferably during the precipitation stage Iridium and/or Rhodium containing compounds or a mixture of both are added. The concentration of these added compounds ranges from $10^{-8}$ to $10^{-3}$ mole per mole of $AgNO_3$, preferably between $0.5*10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

The emulsions of the DTR-element can be spectrally sensitized for exposure by laser light e.g. helium-neon laser light, and semiconductor laser light. Dyes that can be used for adjusting the photosensitivity to laser light have been described in i.a. JA-Pi 62-284344, 62-284345, 62-141561, 62-103649, 62-139555, 62-105147, 62-105148, 62-075638, 62-062353, 62-062354, 62-062355, 62-157027, 62-157028, 62-113148, 61-203446, 62-003250, 60-061752, 55-070834, 51-115821, 51-115822, 51-106422, 51-106423, 51-106425; DE-A-3,826,700; U.S. Pat. Nos. 4,501,811, 4,725,532, 4,784,933; U.S. Ser. No. 07/986,071; GB-P-1,467,638; EP-A 100,654, and in documents cited therein.

In case of exposure by a red light emitting source, e.g. a LED or a HeNe laser a red sensitizing dye is used as disclosed in e.g. EP-A 545,452. In case of exposure by a semiconductor laser special spectral sensitizing dyes suited for the near infra-red are required as disclosed in e.g. EP-A 545,453. To enhance the sensitivity in the red or near infra-red region use can be made of so-called supersensitizers in combination with red or infra-red sensitizing dyes. Suitable supersensitizers are described in Research Disclosure Vol 289, May 1988, item 28952. A preferred red sensitizing dye, infra-red sensitizing dye and supersensitizer are disclosed in EP-A 554,585.

The spectral sensitizers can be added to the photographic emulsions in the form of an aqueous solution, a solution in an organic solvent or in the form of a dispersion.

The silver halide emulsions may contain other suitable stabilizers. Preferably said photosensitive layer also comprises an azaindene, preferably a tetra- or penta-azaindene, more preferably a tetra- or penta-azaindene substituted with a hydroxy or amino group, most preferably 4-hydroxy-6-methyl-1,3,3a,7-tetraazaindene- Said photosensitive layer preferably comprises said azaindene in an amount ranging from 20 mg/mole of silver halide to 2000 mg/mole of silver halide, more preferably from 100 mg/mole of silver halide to 500 mg/mole of silver halide.

Said photosensitive layer preferably also comprises a sulphonated naphtalene-oxazolidine-2-thione, more preferably 7-sulpho-nafto-(2,3-d)-oxazolidine-2-thione. Said photosensitive layer preferably comprises said sulphonated naphtalene-oxazolidine-2-thione in an amount ranging from 60 mg/mole of silver halide to 6000 mg/mole of silver halide, more preferably from 200 mg/mole of silver halide to 1200 mg/mole of silver halide. Said sulphonated naphtalene-oxazolidine-2-thione is preferably used in admixture with an azaindene, more preferably with 4-hydroxy-6-methyl-1,3,3a,7-tetraazaindene.

The silver halide emulsions may contain pH controlling ingredients. Preferably the emulsion layer is coated at a pH value near the isoelectric point of the gelatin to improve the stability characteristics of the coated layer. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions can be found in e.g. Product Licensing index., Vol. 92, December 1971, publication 9232, p. 107–109.

The layer containing physical development nuclei can be free of hydrophilic binder but preferably comprises amounts upto e.g. 80% by weight of the total weight of said layer of a hydrophilic colloid e.g. polyvinyl alcohol to improve the hydrophilicity of the surface. Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are heavy metal salts such as e.g. selenides, polyselenides, polysulphides, mercaptans, and tin (II) halides. Heavy metals, preferably silver, gold, platinum, palladium, and mercury can be used in colloidal form.

Between the support and the silver halide emulsion layer there is preferably provided a base layer that preferably contains an anti-halation substance such as e.g. light-absorbing dyes absorbing the light used for image-wise exposure of the imaging element. As alternative finely divided carbon black can be used as an anti-halation substance. On the other hand, in order to gain sensitivity, light reflecting pigments, e.g. titaniumdioxide can be present in the base layer. Further this layer can contain hardening agents, matting agents, e.g. silica particles, and wetting agents. Suitable matting agents preferably have an average diameter of 2-10 μm and more preferably between 2 μm and 5 μm. The matting agents are generally used in a total amount in the imaging element of 0.1 g/m² to 2.5 g/m². At least part of these matting agents and/or light reflection pigments may also be present in the silver halide emulsion layer and/or in the cover layer. As a further alternative the light reflecting pigments may be present in a separate layer provided between the antihalation layer and the photosensitive silver halide emulsion layer. Like the emulsion layer the base layer is coated preferably at a pH value near the isoelectric point of the gelatin in the base layer.

In a preferred embodiment in connection with the present embodiment a backing layer is provided at the non-light sensitive side of the support. This layer which can serve as anti-curl layer can contain i.a. matting agents e.g. silica particles, lubricants, antistatic agents, light absorbing dyes, opacifying agents, e.g. titanium oxide and the usual ingredients like hardeners and wetting agents. The backing layer can consist of one single layer or a double layer pack.

The hydrophilic layers usually contain gelatin as hydrophilic colloid binder. Mixtures of different gelatins with different viscosities can be used to adjust the rheological properties of the layer. Like the emulsion layer the other hydrophilic layers are coated preferably at a pH value near the isoelectric point of the gelatin. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

The hydrophilic layers of the photographic element, especially when the binder used is gelatin, can be hardened with appropriate hardening agents such as those of the vinylsulfone type e.g. methylenebis(sulfonylethylene), aldehydes e.g. formaldehyde, glyoxal, and glutaraldehyde, N-methylol compounds e.g. dimethylolurea and methyloldimethylhydantoin, active halogen compounds e.g. 2,4-dichloro-6-hydroxy-s-triazine, and mucohalogenic acids e.g. mucochloric acid and mucophenoxychloric acid. These hardeners can be used alone or in combination. The binders can also be hardened with fast-reacting hardeners such as carbamoylpyridinium salts of the type, described in U.S. Pat. No. 4,063,952.

Preferably used hardening agents are of the aldehyde type. The hardening agents can be used in a wide concentration range but are preferably used in an amount of 4% to 7% of the hydrophilic colloid. Different amounts of hardener can be used in the different layers of the imaging element or the hardening of one layer may be adjusted by the diffusion of a hardener from another layer.

The imaging element used according to the present embodiment may further comprise various kinds of surface-active agents in the photographic emulsion layer or in at least one other hydrophilic colloid layer. Examples of suitable surface-active agents are described in e.g. EP 545452. Preferably compounds containing perfluorinated alkyl groups are used.

The photographic material of the present embodiment may further comprise various other additives such as e.g. compounds improving the dimensional stability of the photographic element, UV-absorbers, spacing agents and plasticizers.

Suitable additives for improving the dimensional stability of the photographic element are e.g. dispersions of a water-soluble or hardly soluble synthetic polymer e.g. polymers of alkyl (meth)acrylates, alkoxy(meth) acrylates, glycidyl (meth)acrylates, (meth)acrylamides, vinyl esters, acrylonitriles, olefins, and styrenes, or copolymers of the above with acrylic acids, methacrylic acids, Alpha-Beta-unsaturated dicarboxylic acids, hydroxyalkyl (meth) acrylates, sulphoalkyl (meth) acrylates, and styrene sulphonic acids.

The above described DTR mono-sheet imaging element in connection with the present invention is exposed in an apparatus according to its particular application, e.g. a LED or a laser containing device. Subsequently the imaged element is developed with an alkaline processing liquid in the presence of developing agent(s) and silver halide solvent(s).

The alkaline processing liquid used for developing the imaging element in accordance with the method of the present invention preferably contains a silver halide solvent. Preferably the silver halide solvent is used in an amount between 0.01% by weight and 10% by weight and more preferably between 0.05% by weight and 8% by weight. Suitable silver halide solvents for use in connection with the present invention are e.g. 2-mercaptobenzoic acid, cyclic imides, oxazolidones and thiosulfates. Silver halide solvents that are preferably used in connection with the present invention are thiocyanates and alkanolamines.

Alkanolamines that are suitable for use in connection with the present invention may be of the tertiary, secundary or primary type. Examples of alkanolamines that may be used in connection with the present invention correspond to the following formula:

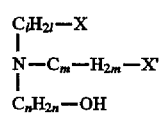

wherein X and X' independently represent hydrogen, a hydroxyl group or an amino group, l and m represent 0 or integers of 1 or more and n represents an integer of 1 or more. Preferably used alkanolamines are e.g. N-(2-aminoethyl)ethanolamine, diethanolamine, N-methylethanolamine, triethanolamine, N-ethyldiethanolamine, diisopropanolamine, ethanolamine, 4-aminobutanol, N,N-dimethylethanolamine, 3-aminopropanol, N,N-ethyl-2,2'-iminodiethanol, 2-aminoethyl-aminoethanol etc. or mixtures thereof.

According to the present invention the alkanolamines are preferably present in the alkaline processing liquid. However part or all of the alkanolamine can be present in one or more layers of the imaging element.

A further suitable type of silver halide solvents are thioether compounds. Preferably used thioethers correspond to the following general formula:

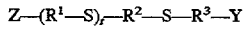

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain an oxygen bridge and t represents an integer from 0 to 10. Examples of thioether compounds corresponding to the above formula are disclosed in e.g. U.S. Pat. No. 4,960,683 and EP-A 547,662, which therefor are incorporated herein by reference.

Still further suitable silver halide solvents are meso-ionic compounds. Preferred meso-ionic compounds for use in connection with the present invention are triazolium thiolates and more preferred 1,2,4-triazolium-3-thiolates.

Preferably at least part and more preferably all of the meso-ionic compound is present in the alkaline processing liquid used for developing the image-wise exposed imaging element. Preferably the amount of meso-ionic compound in the alkaline processing liquid is between 0.1 mmol/l and 25 mmol/l and more preferably between 0.5 mmol/l and 15 mmol/l and most preferably between 1 mmol/l and 8 mmol/l.

However the meso-ionic compound may be incorporated in one or more layers comprised on the support of the imaging element. The meso-ionic compound is in that case preferably contained in the imaging element in a total amount between 0.1 and 10 mmol/m$^2$, more preferably between 0.1 and 5 mmol/m$^2$ and most preferably between 0.5 and 1.5 mmol/m$^2$. More details are disclosed in EP-A-0,554,585.

The alkaline processing liquid used in accordance with the present invention preferably has a pH between 9 and 14 and more preferably between 10 and 13. Said pH may be established by an organic or inorganic alkaline substance or a combination thereof. Suitable inorganic alkaline substances are e.g. potassium or sodium hydroxide, carbonate, phosphate etc. Suitable organic alkaline substances are e.g. alkanolamines. In the latter case the alkanolamines will provide or help maintain the pH and serve as a silver halide complexing agent.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc. However other developing agents can be used.

At least the auxiliary developing agents are preferably incorporated into the photographic material, preferably in the silver halide emulsion layer of the photographic material, in an amount of less than 150 mg/g of silver halide expressed as AgNO$_3$, more preferably in an amount of less than 100 mg/g of silver halide expressed as AGNO$_3$.

According to the present invention the alkaline processing liquid used for developing an imaging element as described above preferably also contains hydrophobizing agents for improving the hydrophobicity of the silver image obtained in the image receiving layer. The hydrophobizing agents used in connection with the present invention are compounds that are capable of reacting with silver or silver ions and that are hydrophobic i.e. insoluble in water or only slightly soluble in water. Generally these compounds contain a mercapto group or thiolate group and one or more hydrophobic substituents e.g. an alkyl group containing at least 3 carbon atoms. Examples of hydrophobizing agents for use in accordance with the present invention are e.g. those described in U.S. Pat. No. 3,776,728, and U.S. Pat. No. 4,563,410. Preferred compounds correspond to one of the following formulas:

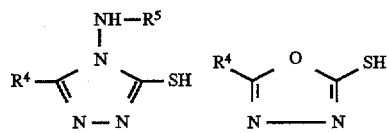

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention the hydrophobizing agents are contained in the alkaline processing liquid in an amount of at least 0.1 g/l, more preferably at least 0.2 g/l and most preferably at least 0.3 g/l. The maximum amount of hydrophobizing agents will be determined by the type of hydrophobizing agent, type and amount of silver halide solvents etc. Typically the concentration of hydrophobizing agent is preferably not more than 1.5 g/l and more preferably not more than 1 g/l.

The alkaline processing liquid preferably also contains a preserving agent having antioxidation activity, e.g. sulphite ions provided e.g. by sodium or potassium sulphite. For example, the aqueous alkaline solution comprises sodium sulphite in an amount ranging from 0.15 to 1.0 mol/l. Further may be present a thickening agent, e.g. hydroxyethylcellulose and carboxymethylcellulose, fog inhibiting agents, e.g. potassium bromide, potassium iodide and a benzotriazole which is known to improve the printing endurance, calcium-sequestering compounds, anti-sludge agents, and hardeners including latent hardeners. In accordance with the present invention it is furthermore preferred to use a spreading agent or surfactant in the alkaline processing liquid to assure equal spreading of the alkaline processing liquid over the surface of the photographic material. Such a surfactant should be stable at the pH of the alkaline processing liquid and should assure a fast overall wetting of the surface of the photographic material. A surfactant suitable for such purpose is e.g. a fluor containing surfactant such as e.g. $C_7F_{15}COONH_4$. It is furthermore advantageous to add glycerine to the alkaline processing liquid so as to prevent crystallization of dissolved components of said alkaline processing liquid.

Development acceleration can be accomplished by addition of various compounds to the alkaline processing liquid and/or one or more layers of the photographic element, preferably polyalkylene derivatives having a molecular weight of at least 400 such as those described in e.g. U.S. Pat. Nos. 3,038,805—No. 4,038,075—No. 4,292,400—No. 4,975,354.

Subsequent to the development in an alkaline processing liquid in accordance with the present invention the surface of the printing plate is preferably neutralized using a neutralization liquid.

A neutralization liquid generally has a pH between 5 and 8. The neutralization liquid preferably contains a buffer e.g. a phosphate buffer, a citrate buffer or mixture thereof. The neutralization solution can further contain bactericides, substances which influence the hydrophobic/hydrophilic balance of the printing plate obtained after processing of the DTR element, e.g. hydrophobizing agents as described above, silica and wetting agents, preferably compounds containing perfluorinated alkyl groups.

A lithographic plate is thus obtained.

According to another embodiment of the present invention a lithographic printing plate can be obtained by means of the DTR-process using an imaging element comprising in the order given a hydrophilic surface of a support, a layer of physical development nuclei and a silver halide emulsion layer.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660, U.S. Pat. No. 4,284,705, EP-A 405,016 and EP-A 450,199 which therefor are incorporated herein by reference.

Flexible supports e.g. a paper support or a resin support are described above.

Said hydrophilic surface of a support may be a hydrophilic metallic support e.g. an aluminum foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 µm, an anodization layer with a thickness between 0.4 and 2.0 µand is sealed with an aqueous bicarbonate solution.

According to the present invention the roughening of the aluminum foil can be performed according to the methods well known in the prior art. The surface of the aluminum substrate can be roughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like $H_2SO_4$, $H_3PO_4$, that if desired, contain additionally one or more corrosion inhibitors such as $Al(NO_3)_3$, $AlCl_3$, boric acid, chromic acid, sulfates, chlorides, nitrates, monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The toughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After roughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ $Al_2O_3$. $H_2O$. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

As binder in the silver halide emulsion layer(s) in connection with the present invention a hydrophilic colloid may be used, usually a protein, preferably gelatin. Gelatin can, however, be replaced in part or integrally by synthetic, semi-synthetic, or natural polymers. Preferably the silver halide emulsion layer contains at least one gelatin species whereof a 10% by weight aqueous solution at 36° C. and pH 6 has a viscosity lower than 20 mPas at a shearing rate of 1000 s$^{-1}$ combined with a gelatin of a higher viscosity. The weight ratio of said low viscosity gelatin versus the gelatin of a higher viscosity is preferably >0.5.

Preferably the gelatin layer(s) is(are) substantially unhardened. Substantially unhardened means that when such gelatin layer is coated on a subbed polyethylene terephtalate film base at a dry thickness of 1.2 g/m$^2$, dried for 3 days at 57C.° and 35% R.H. and dipped in water of 30C.°, said gelatin layer is dissolved for more than 95% by weight within 5 minutes.

The imaging element of the present embodiment may be imaged using a scanning exposure as described above followed by a development step in the presence of development agent(s) and silver halide solvent(s) according to the invention so that a silver image is formed in the physical development nuclei layer. Subsequently the silver halide emulsion layer and any other optional hydrophilic layers are removed by e.g. rinsing the imaged element with water, preferably between 30° C. and 50° C. so that the silver image is exposed.

To facilitate the removal of the silver halide emulsion layer it is advantageous to provide a layer between the hydrophilic surface of a support and the silver halide emulsion layer comprising a hydrophilic non-proteinic film-forming polymer e.g. polyvinyl alcohol, polymer beads e.g. poly(meth)acrylate beads, mixtures thereof, particles of a water insoluble inorganic compound having a number average size not lower than 0.1 μm or alkali insoluble non-polymeric organic compounds having a melting point of at least 50° C. and a number average size between 0.1 μm and 10 μm. Such type of layers are disclosed in EP-A-483415, EP-A-410500, EP-A-94203779.7 and EP-A-95201713.5.

Finally said exposed imaged surface of the hydrophilic support is treated with a finisher to enhance the water-receptivity of the non-image areas and to make the image areas oleophilic ink-receptive.

The lithographic composition often called finisher comprises at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Said (a) hydrophobizing agent(s) is(are) comprised in the finisher preferably in a total concentration between 0.1 g/l and 10 g/l, more preferably in a total concentration between 0.3 g/l and 3 g/l.

Additives improving the oleophilic ink-repellency of the hydrophilic surface areas are e.g. carbohydrates such as acid polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyvinyl alcohol and preferably polyglycols, being the reaction products of ethyleneoxide and/or propyleneoxide with water or an alcohol. Optionally, hygroscopic substances e.g. sorbitol, glycerol, tri(hydroxyethyl)ester of glycerol, and turkish red oil may be added.

A lithographic plate is thus obtained.

The invention will now be illustrated by the following examples without however the intention to limit the invention thereto. All parts are by weight unless otherwise specified.

EXAMPLE 1

Preparation of the silver halide emulsion coating solution.

A gelatin silver halide emulsion I was prepared using the double jet precipitation by mixing whilst stirring an aqueous solution of AgNO$_3$ having a concentration of 3 mole/l, and an aqueous solution having a concentration of 3 mole/l of NaCl and 0.054 mole/l of KBr. Before the precipitation 5*10$^{-4}$ mole/l of sodium hexachlororhodaat was added to the alkali halide solution.

The temperature during the silver halide formation was 50° C. The obtained emulsion was cooled, flocculated and washed. Gelatin was added in an amount sufficient to reach a ratio of ⅔ by weight of gelatin to silver halide, expressed as equivalent amount of silver nitrate.

Subsequently a chemical ripening of the emulsion I was carried out in a conventional way, known to those skilled in the art, by first adding 0.02 mole KI per mole AgNO$_3$ and subsequently thiosulphate and gold salts. A silver chlorobromoiodide emulsion composed of 98.0 mole % of chloride, 1.8 mole % of bromide and 0.2 mole % of iodide and containing Rhodium ions as internal dopant was so prepared. The average silver halide grain size was 0.4 μm (diameter of a sphere with equivalent volume). 4-hydroxy-6-methyl-1,3,3a,7-tetraazaindene was added as stabilizer in an amount of 290 mg/mole of silver halide.

Prior to coating the emulsion I was red sensitised using a red sensitizing dye. Finally 1-phenyl-5-mercaptotetrazole (9.5*10$^{-4}$ mole/mole of silver halide) and 7-sulpho-nafto-(2,3-d)-oxazolidine-2-thione (540 mg/mole of silver halide) were added to the emulsion.

Emulsion II was prepared in an identical way as emulsion I with the exception that 1-phenyl-5-mercaptotetrazole was replaced by an equimolar amount of 2-mercapto-5-n.heptyl-1,3,4-oxadiazole.

Emulsion III was prepared in an identical way as emulsion I with the exception that 1-phenyl-5-mercaptotetrazole was replaced by an equimolar amount of 1-(3-octaanamidophenyl)-5-mercaptotetrazole.

A base layer coating solution was prepared having the following composition:

| | |
|---|---|
| gelatin | 5.5% |
| carbon black | 0.76% |
| silica particles (5 μm) | 1.6% |

Preparation of the imaging elements 1 to 3.

The emulsion coating solutions I to III were respectively coated simultaneously with the base layer coating solution by means of the cascade coating technique to a subbed polyethylene terephthalate support provided with a pack of two backing layers such that the base layer coating was coated directly to the side of the support opposite to the side containing said backing layers. The emulsion layers were coated such that the silver halide coverage expressed as AgNO$_3$ was 1.25 g/m$^2$ and the gelatin content was 1.33 g/m$^2$. The emulsion layers further contained 0.15 g/m$^2$ of 1-phenyl-4,4'-dimethyl-3-pyrazolidone and 0.25 g/m² of hydroquinone. The base layer was coated such that the amount of gelatin in the coated layer was 3 g/m².

The first subbing layer on the backside comprised 3.1 mg/m² of an antistatic composition consisting of 2.2 mg/m² of polystyrene sulphonic acid and 0.9 mg/m² of poly(3,4-ethylenedioxy-thiophene).

The layer nearest to the support of the backing layer pack contained 0.08 g/m² of gelatin. The second backing layer contained 2.8 g/m² of gelatin, 0.065 g/m² of a matting agent consisting of transparent spherical polymeric beads of 3 micron average diameter according to EP-A-080,225, 1.5 g/m² of dispersed barium sulfate (average diameter 0.3–0.4 mµ), 3.0 g/m² of colloidal silica, 0.05 g/m² of hardening agent triacrylformal and 0.021 g/m² of wetting agent $F_{15}C_7$—COONH$_4$.

The thus obtained elements were dried and subjected to a temperature of 40° C. for 5 days and then the emulsion layers were overcoated with a layer containing PdS as physical development nuclei, hydroquinone at 0.4g/m² and formaldehyde at 100mg/m².

The following processing solutions were prepared:

| Activator | A |
| --- | --- |
| sodium hydroxide (g) | 30 |
| sodium sulphite anh. (g) | 35 |
| 1-methyl,4-allyl,5-methyl 1,2,4-triazolium-3-thiolate (mg) | 1100 |
| 2-Aminoethyl-aminoethanol (ml) | 20 |
| 2-mercapto-5-n.heptyl-oxa-3,4-diazole (mg) | 350 |
| water to make | 1 l |
| Neutralization solution | |
| citric acid | 10 g |
| sodium citrate | 35 g |
| sodium sulphite anh. | 5 g |
| phenol | 50 mg |
| water to make | 1 l |

The above described imaging elements 1 to 3 were image-wise exposed in a LED image setter and processed with the above described activator for 20 seconds at 30° C., subsequently neutralized at 25° C. with the neutralization solution described above and dried.

The results are summed up in the following table.

The sensitometric properties sensitivity and gradient in the toe were evaluated as follows:

Sensitivity: the negative logaritme of the exposure at the density=(Dmax+Dmin)/2. A higher number means a more sensitive material.

Gradient toe: the average gradient between Dmin+0.10 and Dmin+0.25.

TABLE 1

| Imaging element | Sensitivity | Gradient toe |
| --- | --- | --- |
| 1 | 1.17 | 0.67 |
| 2 | 1.43 | 0.76 |
| 3 | 1.28 | 0.67 |

It is clear from the results of table 1 that an imaging element 3, comprising 1-(3-octaanamidophenyl)-5-mercaptotetrazole as stabilizer (imaging element according to the invention) has a higher sensitivity when exposed by high intensity-short time exposure than imaging elements 1 (comparison imaging element) comprising 1-phenyl-5-mercaptotetrazole. The gradient toe remains the same.

It is further clear from the results of table 1 that an imaging element 2, comprising 2-mercapto-5-n.heptyl-1,3,4-oxadiazole as stabilizer (imaging element according to the invention) has a much higher sensitivity when exposed by high intensity-short time exposure than imaging elements i (comparison imaging element) comprising 1-phenyl-5-mercaptotetrazole. The gradient toe which is a measure for the tendency to staining (a higher value means less tendency to staining) is also better for imaging element 2 than for imaging elements 1.

I claim:

1. A method for making a lithographic printing plate according to the silver salt diffusion transfer process comprising the following steps:

image-wise exposing with a high intensity-short time exposure an imaging element comprising on a support in the order given a photosensitive layer comprising at least one photosensitive silver halide emulsion and a heterocyclic compound containing at least one nitrogen atom in the ring and an image receiving layer comprising physical development nuclei in water permeable relationship with said photosensitive layer, developing said imaging element using an alkaline processing liquid in the presence of (a) developing agent(s) and (a) silver halide solvent(s), wherein said heterocyclic compound containing at least one nitrogen atom in the ring comprises at least one mercapto- or thione group and one substituent comprising at least 5 carbon atoms selected from the group consisting of linear or branched alkyls, alkenyls, alkynyls, aralkyls and alkylaryls.

2. A method according to claim 1 wherein said photosensitive emulsion layer comprises said heterocyclic compound containing at least one nitrogen atom in the ring in an amount ranging from 0.0001 mole/mole of silver halide to 0.01 mole/mole of silver halide.

3. A method according to claim 1 wherein said heterocyclic compound containing at least one nitrogen atom in the ring is selected from the group consisting of 2-mercapto-5-alkyl-1,3,4-thiadiazoles and 2-mercapto-5-alkyl-1,3,4-oxadiazoles, said alkyls containing at least 5 carbon atoms.

4. A method according to claim 1 wherein said heterocyclic compound containing at least one nitrogen atom in the ring corresponds to the following formula:

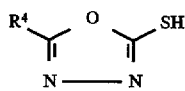

wherein $R^4$ represents an alkyl containing 5 to 17 C-atoms.

5. A method according to claim 4 wherein $R^4$ represents an alkyl containing 5 to 11 C-atoms.

6. A method according to claim 5 wherein $R^4$ represents an alkyl containing 7 C-atoms.

7. A method according to claim 1 wherein said photosensitive layer comprises 4-hydroxy-6-methyl-1,3,3a,7-tetraazaindene.

8. A method according to claim 7 wherein said photosensitive layer comprises 4-hydroxy-6-methyl-1,3,3a,7-tetraazaindene in an amount ranging from 100 mg/mole of silver halide to 500 mg/mole of silver halide.

9. A method according to claim 1 wherein said photosensitive layer comprises a sulphonated naphtalene-oxazolidine-2-thione.

* * * * *